(12) United States Patent
Tagawa et al.

(10) Patent No.: US 9,142,300 B2
(45) Date of Patent: Sep. 22, 2015

(54) MEMORY SYSTEM INCLUDING NONVOLATILE MEMORY (71) Applicant: KABUSHIKI KAISHA TOSHIBA, Minato-ku (JP)

(72) Inventors: Hiroki Tagawa, Tokyo (JP); Hidetaka Tsuji, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/104,270

(22) Filed: Dec. 12, 2013

(65) Prior Publication Data

US 2015/0063034 A1    Mar. 5, 2015

Related U.S. Application Data (60) Provisional application No. 61/872,943, filed on Sep. 3, 2013.

(51) Int. Cl.
*G11C 16/10* (2006.01)
*G11C 16/26* (2006.01)

(52) U.S. Cl.
CPC ............... *G11C 16/10* (2013.01); *G11C 16/26* (2013.01)

(58) Field of Classification Search
USPC ......................... 365/185.18, 185.09
See application file for complete search history.

(56) References Cited

U.S. PATENT DOCUMENTS

| 8,081,512 | B2 | 12/2011 | Ueno et al. | |
|---|---|---|---|---|
| 2008/0112222 | A1* | 5/2008 | Shirakawa | ............... 365/185.03 |
| 2010/0275094 | A1 | 10/2010 | Honda | |
| 2012/0002475 | A1 | 1/2012 | Ueno et al. | |

FOREIGN PATENT DOCUMENTS

| JP | 8-235028 | 9/1996 |
|---|---|---|
| JP | 2009-266349 | 11/2009 |
| JP | 2010-277584 | 12/2010 |

\* cited by examiner

*Primary Examiner* — James G Norman
(74) *Attorney, Agent, or Firm* — Oblon, McClelland, Maier & Neustadt, L.L.P.

(57) ABSTRACT

According to one embodiment, a memory system includes a nonvolatile memory and a control circuit. The nonvolatile memory includes a storage area having a plurality of memory cells configured to store data. The control circuit determines whether data write to the storage area is possible or impossible.

17 Claims, 9 Drawing Sheets

(CaseA)

FIG. 1

(CaseB)

F I G. 5   Word line direction

Package PIN arrangement

F I G. 6

PINNAMES

| PIN Number | NAND flash memory | |
| --- | --- | --- |
| | PIN Name | Description |
| 29 to 32, 41 to 44 | I/O1 to I/O8 | I/O port |
| 9 | $\overline{CE}$ | Chip enable |
| | | Chip enable |
| 18 | $\overline{WE}$ | Write enable |
| 8 | $\overline{RE}$ | Read enable |
| 16 | CLE | Command latch enable |
| 17 | ALE | Address latch enable |
| 39 | PSL | Power on select |
| 19 | $\overline{WP}$ | Write protect |
| 7 | RY/$\overline{BY}$ | Ready/Busy |
| 12, 37 | Vcc | Power supply |
| 13, 36 | Vss | Ground |
| 10 | NC | Non Connection |
| 15 | NC | Non Connection |
| 33 | NC | Non Connection |
| 34 | NC | Non Connection |
| 35 | NC | Non Connection |

| Flag | Data | Determination |
|------|------|---------------|
| 1 | 1 | Write is possible |
| 0 | 1 | Write is impossible |
| 0 | X | Write is impossible |
| 0 | 0 | Write is impossible |

MEMORY SYSTEM INCLUDING NONVOLATILE MEMORY

CROSS-REFERENCE TO RELATED APPLICATIONS

This application claims the benefit of U.S. Provisional Application No. 61/872,943, filed Sep. 3, 2013, the entire contents of which are incorporated herein by reference.

FIELD

Embodiments described herein relate generally to a memory system including a nonvolatile memory.

BACKGROUND

Recent memory systems including a nonvolatile memory, for example, a NAND flash memory widely use a NAND flash memory that performs write on a page basis.

DETAILED DESCRIPTION

A memory cell of a NAND flash memory can have one of a plurality of threshold voltages. Different data are assigned to the plurality of threshold voltages. The memory cell is controlled so as to have a threshold voltage corresponding to data to be written and thus stores the data.

A case will be exemplified below in which in a single level cell (SLC), data "1" is assigned to a threshold lower than the read voltage, and data "0" is assigned to a threshold higher than the read voltage. The single level cell records 1-bit data in one memory cell.

In the NAND flash memory, writing data to a block can be done in order of the page immediately after block erase operation has been performed. However, when access to the NAND flash memory is then repeated, the write target page may correspond to a case A or case B to be described later. In this case, abnormal write may occur in write later.

Figure 1:
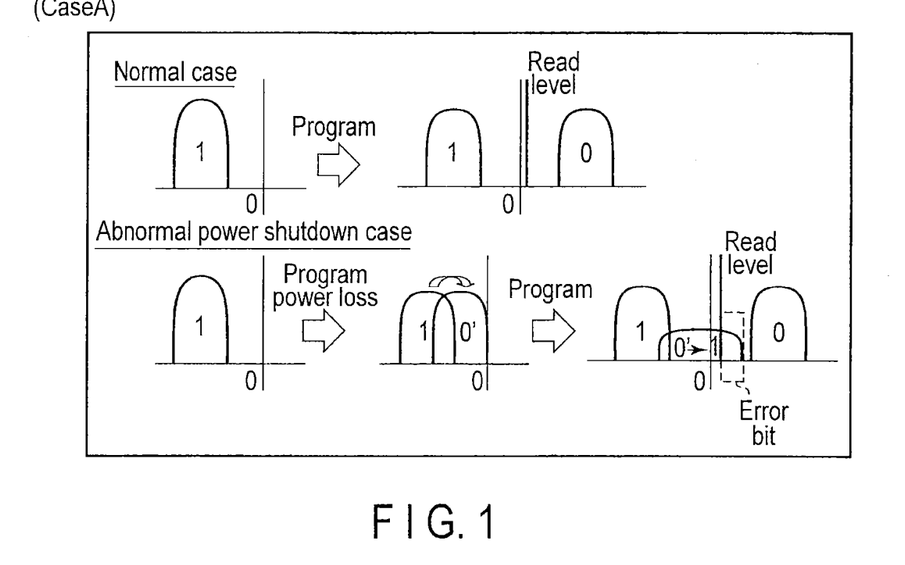
FIG. 1 is a view showing a bit distribution when abnormal power shutdown occurs during write (case A)

FIG. 1 shows the threshold voltage distribution of a memory cell when abnormal power shutdown occurs during write (case A). Note that the threshold to which data "1" is assigned will be referred to as "1", and the threshold to which data "0" is assigned will be referred to as "0" hereinafter for the descriptive convenience.

When "0" is written to a memory cell (data "1") of a page, the data of the memory cell shifts from "1" to "0" in a normal case.

On the other hand, if abnormal power shutdown has occurred during write, the data of the memory cell shifts from "1" to the "0" side (0'). In this state, the whole page is read as "FFh" and appears to have been erased. Note that an unwritten (or erased) memory cell is "1". In addition, "h" indicates a hexadecimal number.

However, when "1" is then written to the memory cell (data "0" is set), the threshold of the memory cell rises due to program disturb, and an error bit occurs. Program disturb is a fail mode that occurs when write is repetitively done for the same word line, and the threshold of unselected memory cells sharing the word line rises.

Figure 2:
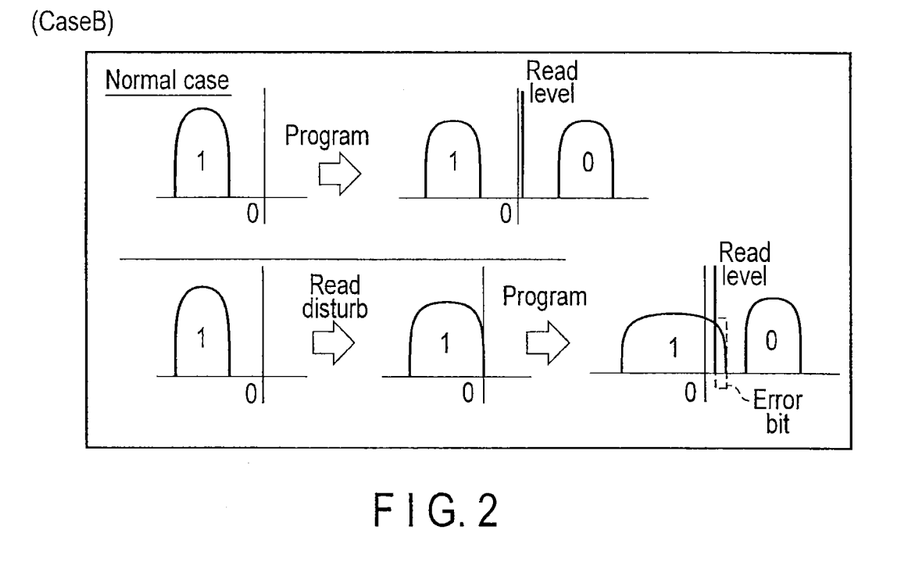
FIG. 2 is a view showing a bit distribution when excessive read disturb stress is applied (case B)

FIG. 2 shows the threshold voltage distribution of a memory cell when excessive read disturb stress is applied (case B). Read disturb is a fail mode that occurs, for example, when a read operation is repetitively performed for the same memory cell, and the threshold of unselected memory cells gradually rises.

When "0" is written to a memory cell (data "1" is set) of a page, the data of the memory cell shifts from "1" to "0" in a normal case.

Sometimes, however, excessive read disturb stress occurs, and the data of the memory cell slightly shifts from "1" to the "0" side (0'), as shown in FIG. 2. In this state, the whole page is read as "FFh" and appears to have been erased. However, when "0" is written to a memory cell connected to the same word line as this memory cell (data "1" shifted to the "0" side), the threshold of the memory cell further rises due to program disturb, and an error bit occurs.

When the case A or case B occurs, no write error is returned from the NAND flash memory. For this reason, the NAND controller recognizes the abnormality only when the data is read. This poses a problem in implementing reliable data management.

To cope with this problem, the NAND controller often attempts to avoid the occurrence of abnormal write itself by applying (1) to (3) to be described below. However, any of them has a problem.

(1) After power-on, write is performed to a different block every time assuming that abnormal power shutdown may have occurred during previous write. Although this method is safe and simple, the write efficiency lowers.

(2) Write is performed to store a state "write start" or "write end" in another block. A page that remains in the "write start"

state is regarded as a page in which abnormal power shutdown has occurred, and write is performed to a different block. This method wastefully needs to write "write start" or "write end" to another block at each time of write. In addition, since the written state of the block to save the written state is unknown, (1) needs to be partially implemented.

(3) Whether abnormal power shutdown has occurred is judged by a special method, for example, checking the target page while changing the read level. If there is no problem, write is performed. This method requires thorough knowledge of the NAND flash memory and cannot therefore be used by everybody. Additionally, since a NAND flash memory equipped with a controller does not support special read, it cannot handle this method.

Embodiments to solve these problems will now be described with reference to the accompanying drawing. In the following explanation, the same reference numerals denote elements having the same functions and arrangements, and a repetitive explanation will be made only when necessary.

In general, according to one embodiment, a memory system comprises a nonvolatile memory and a control circuit. The nonvolatile memory includes a storage area having a plurality of memory cells configured to store data. The control circuit determines whether data write to the storage area is possible or impossible.

First Embodiment

[1] Outline of Memory System

A memory system according to this embodiment includes, for example, one or a plurality of NAND flash memories, and a controller (control circuit) that controls write, read, and erase of the NAND flash memories. All the NAND flash memories included are controlled as logic memories by one controller.

System data (firmware FW) and boot data necessary for the controller are automatically read from the NAND flash memory and transferred to a data register (buffer RAM) in the initialization operation (power-on initial setup operation) automatically executed after power-on. This read control is done by, for example, a hardware sequencer prepared in the controller.

[2] Arrangement of Memory System

Figure 3:
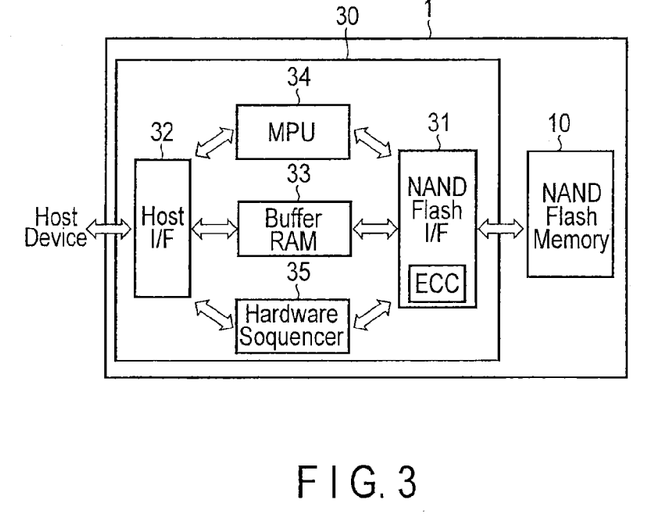
FIG. 3 is a block diagram showing the arrangement of a memory system according to the first embodiment.

FIG. 3 is a block diagram showing the arrangement of the memory system according to the first embodiment.

A memory system 1 includes a NAND flash memory (to be referred to as a NAND memory hereinafter) 10, and a memory controller 30 that controls write, read, and erase of the NAND memory 10.

The NAND memory 10 includes one or a plurality of semiconductor memory chips. The NAND memory 10 is controlled by one memory controller 30 independently of whether it includes one or a plurality of semiconductor memory chips. The maximum number of semiconductor memory chips includable is decided by the current ability of a regulator or the relationship to other factors. For example, four chips can be included.

The memory controller 30 is a 1-chip controller including a NAND flash I/F 31, a host I/F 32, a buffer RAM 33, an microprocessing unit (MPU) 34, and a hardware sequencer 35.

The NAND flash I/F 31 is an interface that performs data transfer to/from the NAND memory 10. The NAND flash I/F 31 also includes an error checking and correction (ECC) circuit. The ECC circuit corrects errors in data to be transferred between the NAND memory 10 and the NAND flash I/F 31.

The host I/F 32 is an interface that performs data transfer to/from the host device. The buffer RAM 33 temporarily holds firmware, read/write data, and the like. The MPU 34 controls data transfer.

Firmware that is the control program of the memory controller 30 is recorded in, for example, the NAND memory 10 and loaded to the buffer RAM 33 by the hardware sequencer 35. The hardware sequencer 35 performs sequence control of firmware read/write, and the like.

The NAND memory 10 and the memory controller 3D are formed on different chips (different semiconductor substrates), respectively. The NAND memory 10 and the memory controller 30 are sealed by different resin materials, respectively. Note that forming the NAND memory 10 and the memory controller 30 on different chips is not essential for this memory system.

Figure 4:
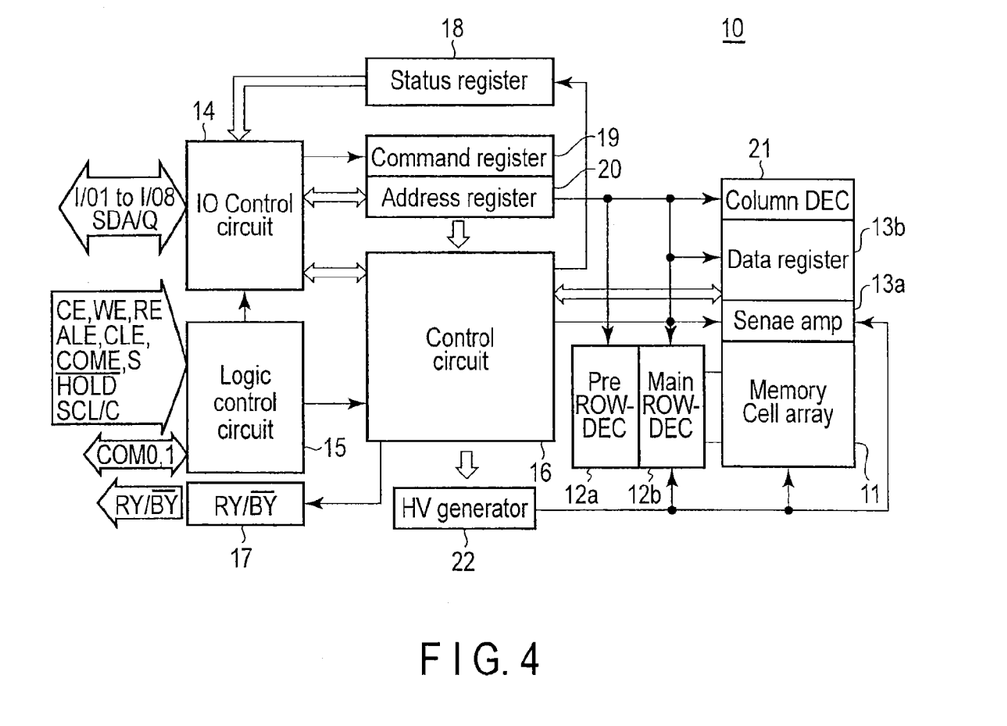
FIG. 4 is a functional block diagram of a NAND flash memory in the memory system.
Figure 5:
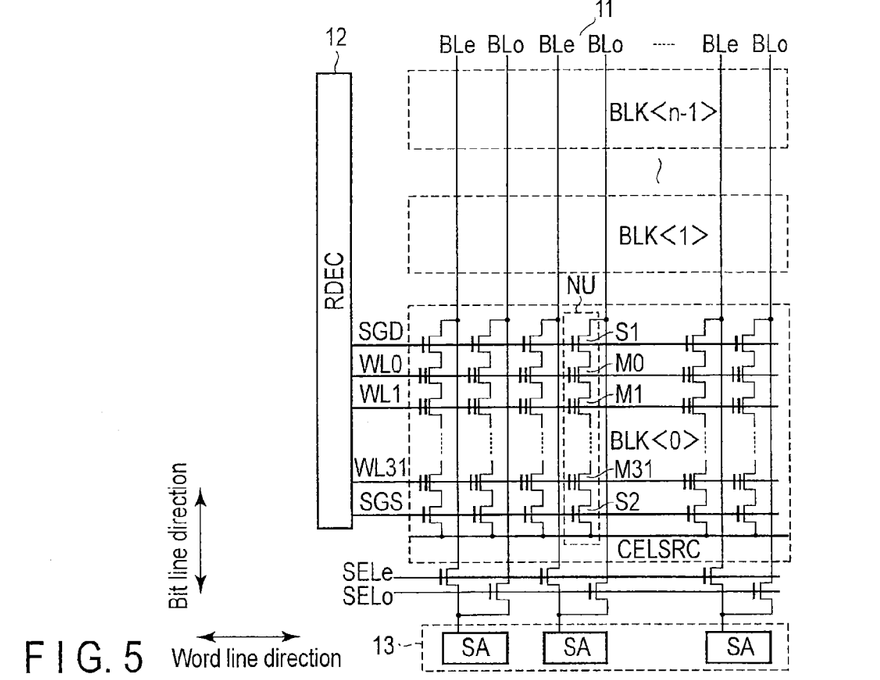
FIG. 5 is a view showing the arrangement of a memory cell array in the NAND flash memory.

FIG. 4 is a block diagram showing the functional arrangement of the NAND flash memory 10. FIG. 5 shows the arrangement of a memory cell array in the NAND flash memory 10.

As shown in FIG. 5, a memory cell array 11 includes a plurality of blocks BLK<0> to BLK<n−1>. The blocks BLK<0> to BLK<n−1> are arranged in the bit line direction. Each of the blocks is the minimum unit of data erase. Note that n is a natural number of 1 or more.

Each of the blocks BLK<0> to BLK<n−1> includes a plurality of NAND cell units (NAND strings) NU arranged in the word line direction perpendicular to the bit line direction.

Each NAND cell unit NU includes a plurality of nonvolatile memory cells (in the illustrated example, 32 memory cells) M0 to M31, and two select gate transistors S1 and S2. Each of the nonvolatile memory cells M0 to M31 is an electrically rewritable memory cell transistor, and includes a floating gate electrode and a control gate electrode.

The current paths of the nonvolatile memory cells M0 to M31 are connected in series. The select gate transistors S1 and S2 are respectively connected to the two ends of the current path of the nonvolatile memory cells M0 to M31 connected in series.

One terminal (select gate transistor S1) of the NAND cell unit NU is connected to a bit line BLo or BLe. The other terminal (select gate transistor S2) of the NAND cell unit NU is connected to a common source line CELSRC.

The control gate electrodes of the memory cells M0 to M31 are connected to word lines WL0 to WL31, respectively. The gates of the select gate transistors S1 and S2 are connected to select gate lines SGD and SGS, respectively.

A sense amplifier circuit 13 is arranged on one end side of the even-numbered bit lines BLe and the odd-numbered bit lines BLo, and used to read/write data from/to the memory cells. An RDEC 12 is arranged on one end side of the word lines and the select gate lines, and selects and drives them.

In FIG. 5, the even-numbered bit lines BLe and the odd-numbered bit lines BLo adjacent to each other are selected by bit line selection circuits (select lines SELo and SELe). The selected even-numbered bit lines BLe and the odd-numbered bit lines BLo are connected to sense amplifiers SA of the sense amplifier circuit 13.

As shown in FIG. 4, commands, addresses, and data are input via an IO control circuit 14. A chip enable signal /CE, a write enable signal /WE, a read enable signal /RE, and other external control signals are input to a logic control circuit 15 and used for timing control.

A control circuit 16 performs data transfer control and write/erase/read sequence control. A status register 17 outputs the Ready/Busy state of the NAND memory 10 to the Ready/Busy terminal. Also prepared is a status register 18 that notifies the controller 30 of the state of the NAND memory 10 via the IO control circuit 14. The status register 18 stores, for example, a status indicating that write to a page of the memory cell array 11 is possible or impossible.

A command is decoded by a command register 19. An address is transferred to the RDEC 12 (pre ROW-DEC 12*a* and main ROW-DEC 12*b*) and a column DEC 21 via an address register 20.

Write data is loaded to the sense amplifier circuit 13 (sense amplifier 13*a* and data register 13*b*) via the IO control circuit 14 and the control circuit 16. Read data is externally output via the control circuit 16 and the IO control circuit 14.

A high voltage (HV) generator 22 generates a necessary high voltage in accordance with each operation mode. The HV generator 22 supplies a predetermined high voltage to the memory cell array 11, the main ROW-DEC 12*b*, and the sense amplifier 13*a* based on an instruction given by the control circuit 16.

The blocks including the memory cell array 11 and the control circuit 16 shown in FIG. 4 are formed on the same chip (semiconductor substrate) and sealed by the same resin material.

Figure 6:
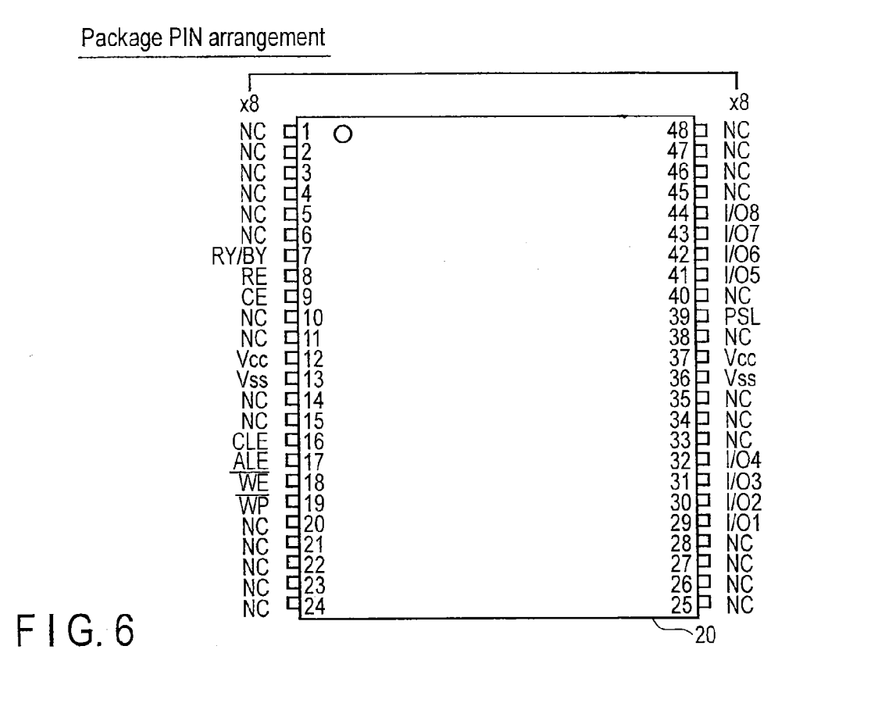
FIG. 6 is a view showing the pin arrangement of the package of the NAND flash memory.
Figure 7:
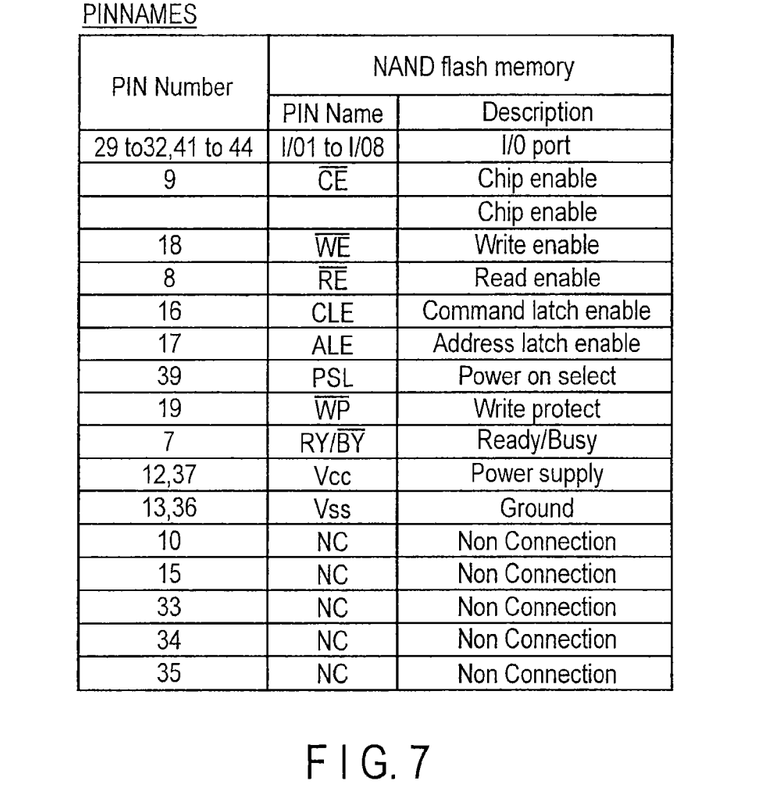
FIG. 7 is a view showing the names and functions of the pins of the package.

FIG. 6 shows the pin arrangement of the package of the NAND flash memory 10. FIG. 7 shows the names and functions of the pins altogether.

Input/output ports I/O1 to I/O8 input/output commands, addresses, and data on the Byte basis. As terminals to input external control signals, terminals for the chip enable signal /CE, the write enable signal /WE, the read enable signal /RE, a command latch enable signal CLE, an address latch enable signal ALE, and the like are provided.

I/O signals are address, data, and command signals. The command latch enable signal CLE is a signal to control operation command input to the NAND memory 10. When the command latch enable signal CLE is set to "H" level at the leading or trailing edge of the write enable signal /WE, data on the input/output ports I/O1 to I/O8 are input to the NAND memory 10 as command data.

The address latch enable signal ALE is a signal to control address data input to the NAND memory 10. When the address latch enable signal ALE is set to "H" level at the leading or trailing edge of the write enable signal /WE, data on the input/output ports I/O1 to I/O8 are input to the NAND memory 10 as address data.

The chip enable signal /CE is a device selection signal. In the Ready state, when the chip enable signal /CE is set to "H" level, a low-power standby mode is set.

The write enable signal /WE is a signal to input data from the input/output ports I/O1 to I/O8 to the device.

The read enable signal /RE is a signal to cause the input/output ports I/O1 to I/O8 to serially output data.

[3] Writability Determination Function

In the first embodiment, the NAND flash memory 10 has a writability determination function. The control circuit 16 in the NAND memory 10 writes a write determination flag to the memory cell array 11, and determines based on this flag whether the write is possible. This prevents the above-described abnormal write.

Figure 8:
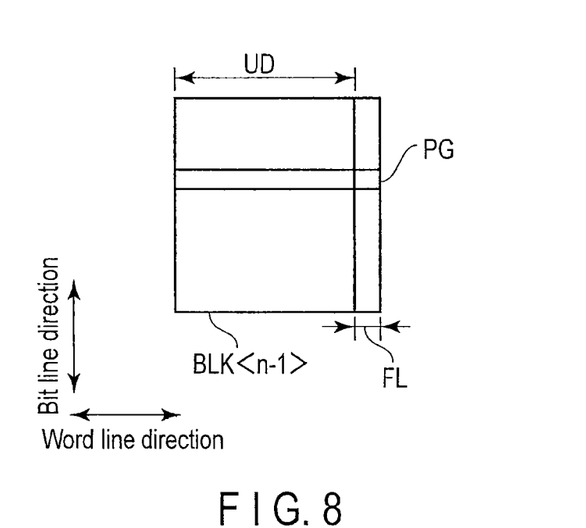
FIG. 8 is a view showing the storage area of a block in the memory cell array of the NAND flash memory.

FIG. 8 is a view showing the storage area of a block in the memory cell array 11 of the NAND memory 10.

The memory cell array 11 in the NAND memory 10 includes the plurality of blocks BLK<0> to BLK<n-1>, as described above. The block BLK<n-1> includes a plurality of pages PG arranged in the bit line direction. Each page PG is formed from a plurality of memory cell transistors that use the same word line as control gates. The memory cell transistors are arranged in the word line direction.

The page PG includes a user data portion UD and a flag portion FL. The user data portion UD includes, for example, an 8-Kbyte data area and a 640-byte ECC area. The data area stores normal data. The ECC area stores ECC information used to correct errors in the data stored in the data area.

The flag portion FL has a storage capacity of, for example, 1 to 8 bytes. The flag portion FL stores a write determination flag indicating whether write to the page is possible or impossible. For example, when 4-byte data is used as the write determination flag, and data of 2 bytes or more is "0" (written state), it is determined that write is impossible.

Note that in a multilevel cell (MLC), the flag portion FL may store a flag used to judge whether the word line has a binary state or quaternary state.

A method of writing the write determination flag in the flag portion FL of the page PG will be explained next.

Figure 9:
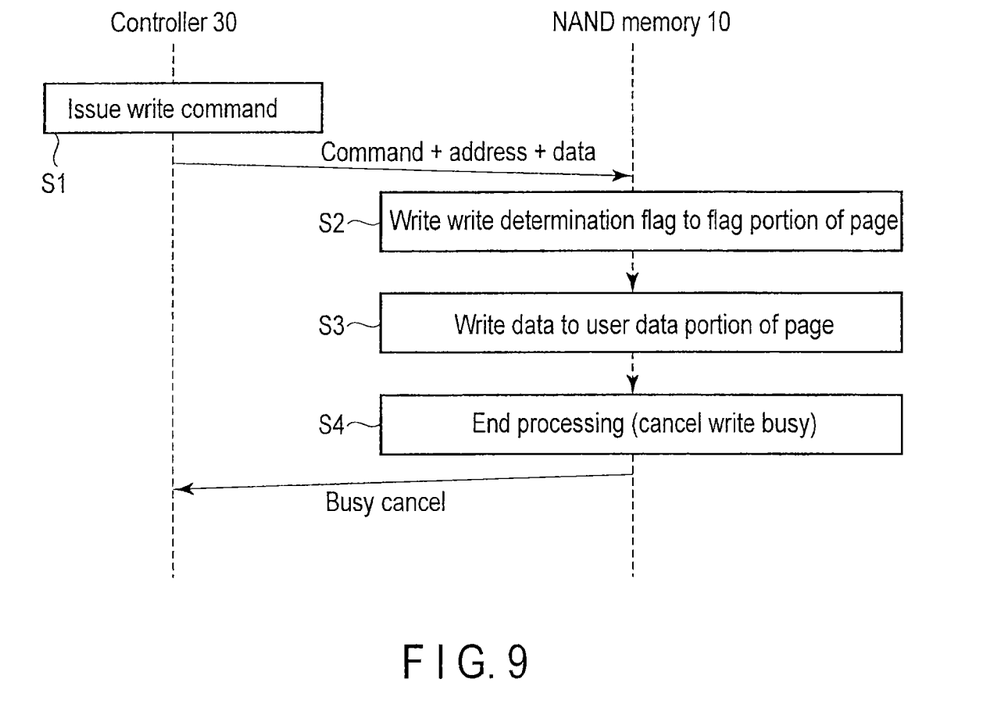
FIG. 9 is a sequence chart showing transmission/reception between a controller and the NAND flash memory when writing a write determination flag.
Figure 10:
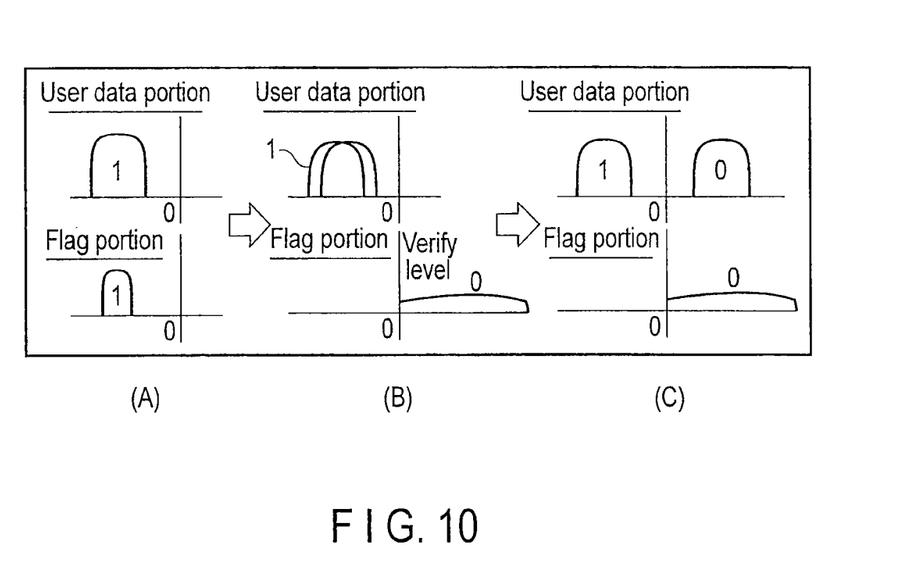
FIG. 10 is a view showing a bit distribution indicating the written state in a user data portion and a flag portion.

FIG. 9 is a sequence chart showing transmission/reception between the memory controller 30 and the NAND memory 10 when writing the write determination flag in the flag portion FL. FIG. 10 is a view showing a bit distribution indicating the written state in the user data portion UD and the flag portion FL.

First, the controller 30 issues a write command to the NAND memory 10 (step S1). At this time, the controller 30 transmits a page address and write data together with the write command.

Upon receiving the write command and the page address, the control circuit 16 in the NAND memory 10 writes "0" to the flag portion FL of the page designated by the page address as the write determination flag (step S2). That is, the control circuit 16 writes "0" to the plurality of memory cells ("1") in the flag portion FL ((A)→(B) in FIG. 10) before the write data is written to the user data portion UD of the page. At this time, the threshold of the memory cells to which "0" is written need only be equal to or higher than the verify level. In this case, "1" represents the erased state, and "0" represents the written state.

After that, the control circuit 16 writes the write data to the user data portion UD of the page (step S3) ((B)→(C) in FIG. 10). When the write of the write determination flag and the write data has thus ended, the control circuit 16 cancels busy (step S4).

When write to the flag portion FL is performed before write to the user data portion UD, the time of write to the flag portion FL is added to the page write time, and the threshold of the memory cell ("1") of the user data portion UD shifts to the "0" side, as indicated by (B) of FIG. 10, and the performance deteriorates. However, since the write to the flag portion FL can be rough, the shift amount of the threshold of the memory cell of the user data portion UD is small, and the performance does not deteriorate largely.

If such deterioration of performance is not allowed, a switching means for enabling or disabling the write determination flag write function is provided in the NAND memory 10. The control circuit 16 controls the switching means, thereby writing the write determination flag only when necessary. Deterioration of the memory cell performance is thus minimized.

Note that when the change in the threshold of the memory cell falls within an unproblematic range even if the write is performed simultaneously to the flag portion FL and the user data portion UD, the write can be performed simultaneously to the flag portion FL and the user data portion UD.

Read of the write determination flag written to the flag portion FL of the page PG will be described next.

Figure 11:
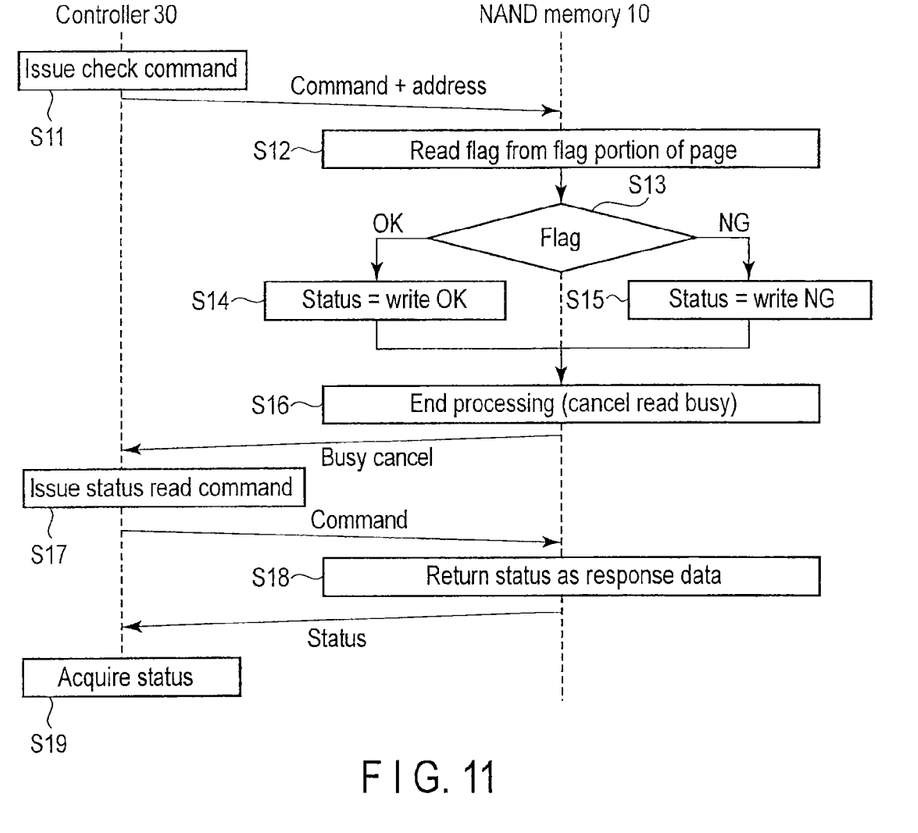
FIG. 11 is a sequence chart showing transmission/reception between the controller and the NAND flash memory when reading the write determination flag.

FIG. 11 is a sequence chart showing transmission/reception between the controller 30 and the NAND memory 10 when reading the write determination flag from the flag portion FL.

First, the controller 30 issues, to the NAND memory 10, a check command to check whether write (additional write) is possible or impossible (step S11). At this time, the controller 30 transmits a page address together with the check command.

Upon receiving the check command and the page address, the control circuit 16 in the NAND memory 10 reads the write determination flag from the flag portion FL of the page designated by the page address (step S12). That is, the flag portion FL of the page is read by the threshold voltage for flag determination.

Next, the control circuit 16 determines whether the write determination flag read from the flag portion FL indicates that write is possible (step S13). If write is possible, a status indicating that write is possible is stored in the status register 18 of the NAND memory 10 (step S14). On the other hand, if write is impossible, a status indicating that write is impossible is stored in the status register 18 (step S15).

When the check of the write determination flag has thus ended, the control circuit 16 cancels busy (step S16).

Upon receiving busy cancel from the NAND memory 10, the controller 30 issues, to the NAND memory 10, a status read command to read whether write to the page is possible or impossible (step S17).

Upon receiving the status read command, the control circuit 16 in the NAND memory 10 returns the status stored in the status register 18 to the controller 30 as response data (step S18).

The controller 30 receives the status from the NAND memory 10, and recognizes based on the status whether write to the page is possible or impossible (step S19).

The input timings of the write command, check command, page address, and status read command from the controller 30 to the NAND memory 10 will be described below.

Figure 12:
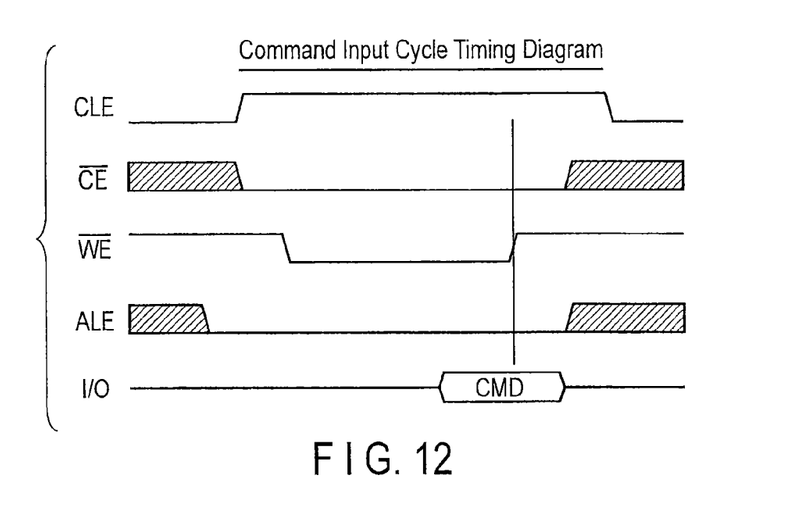
FIG. 12 is a timing chart of write command and check command input.

FIG. 12 is a timing chart of write command and check command input.

The command latch enable signal CLE changes to "H", the chip enable signal /CE changes to "L", the address latch enable signal ALE is disabled ("L"), and the write enable signal /WE changes to "L". After that, input of the write command or check command "CMD" is enabled in synchronism with the "H" transition of the write enable signal /WE.

Figure 13:
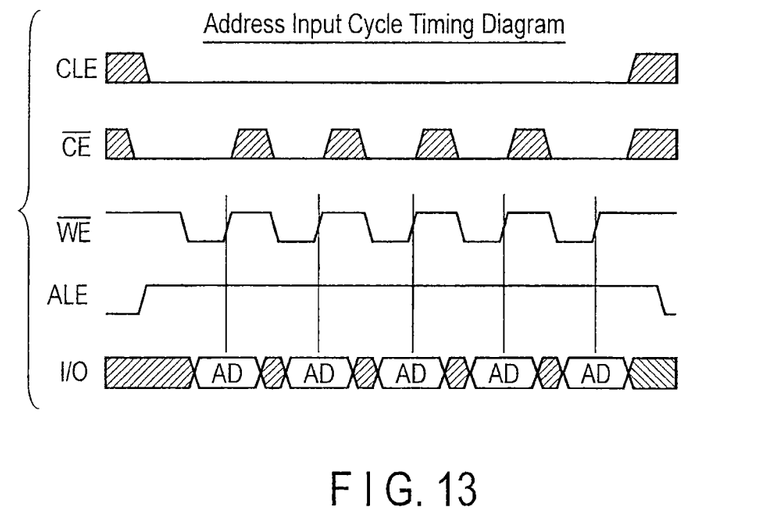
FIG. 13 is a timing chart of page address input.

FIG. 13 is a timing chart of page address input.

The address latch enable signal ALE changes to "H". During the period where the address latch enable signal ALE is at "H" level, for example, chip, plane, block, and page addresses AD of 3-byte are input in synchronism with the write enable signal /WE.

Figure 14:
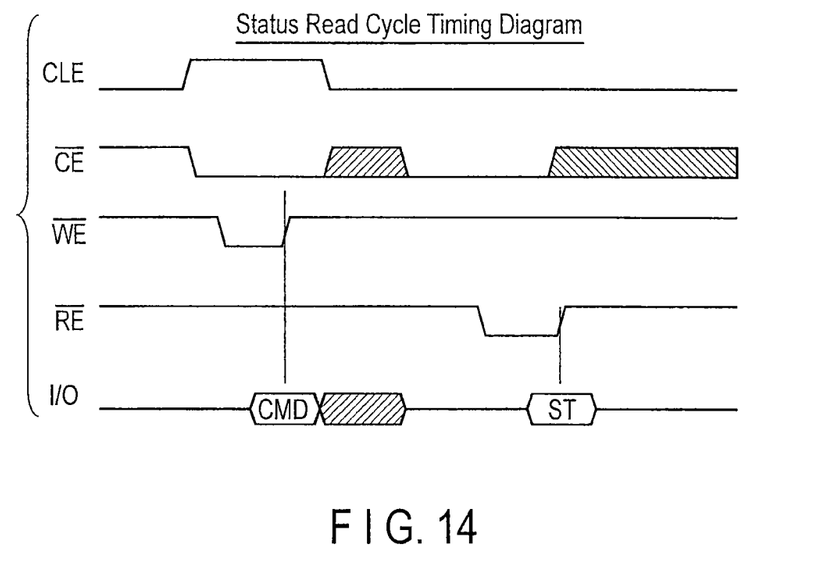
FIG. 14 is a timing chart of status read command input and status output.

FIG. 14 is a timing chart of status read command input and status output.

The status read command "CMD" is input in synchronism with the write enable signal /WE. After that, the status "ST" is read in synchronism with the read enable signal /RE.

How to determine whether the write (additional write) is possible or impossible based on the states of the data and the write determination flag stored in the user data portion UD and the flag portion FL, respectively, will be described next.

Figure 15:
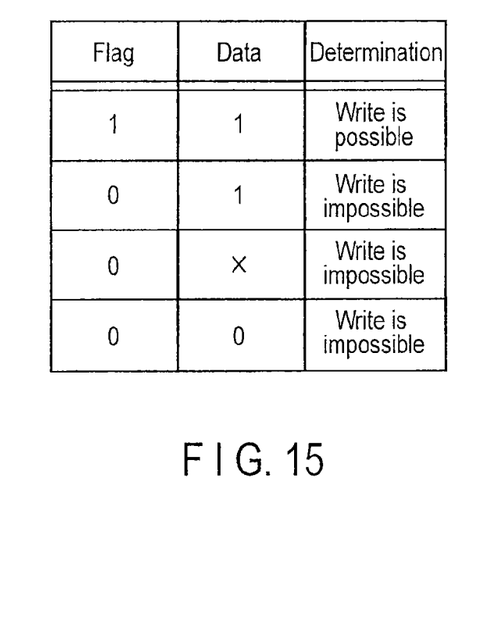
FIG. 15 is a view showing determination results by the write determination flag.

FIG. 15 is a view showing determination results by the write determination flag stored in the flag portion FL.

When the flag is "1", and the data is "1", write is not performed, that is, nothing is written, and write is possible.

When the flag is "0", and the data is "1", abnormality has occurred during the write operation, and write is impossible.

When the flag is "0", and the data cannot be read, the data is not normally written, and write is impossible.

When the flag is "0", and the data is "0", the data is normally written, and write is impossible in this case as well.

As described above, write is possible only when the write determination flag is "1". When the flag is "0", write is impossible in any case. Hence, whether write is possible or impossible can be determined by determining only the write determination flag.

In the first embodiment, the write determination flag is written before data is written at the time of write, thereby obtaining the following advantages. Assume that after the write determination flag is written, power shutdown has occurred during data write, and the memory cell to which the data is being written changes to the "0" state shown in FIG. 1. Even in this case, since the write determination flag is written first, the controller can recognize that the write to the page is impossible. Also assume that power shutdown has occurred during write of the write determination flag, and the memory cell to which the write determination flag is being written changes to the "0" state shown in FIG. 1. In this case, even if it is determined in the write later that the write to the page is possible, the write can be performed in the page because the write has not been performed yet to the memory cell to write data at the previous time of write. Hence, even when power shutdown has occurred during write, it is possible to prevent data from erroneously being written.

That is, even when abnormal power shutdown has occurred during write, it is possible to determine whether write to the page is possible and prevent abnormal write (error bit) from occurring in write later.

Second Embodiment

In the first embodiment, the control circuit 16 in the NAND flash memory 10 controls the operations of the write command and the check command. In the second embodiment, a controller 30 shown in FIG. 3 controls the operations of these commands.

The hardware arrangement of a memory system according to the second embodiment is the same as in the first embodiment, and a description thereof will be omitted. A NAND memory 10 and the controller 30 are formed on different chips (different semiconductor substrates), respectively. The NAND memory 10 and the memory controller 30 are sealed by different resin materials, respectively.

[1] Writability Determination Function

In the second embodiment, a write command and a check command are input from a host device. The controller 30 controls the operations of these commands.

Figure 16:
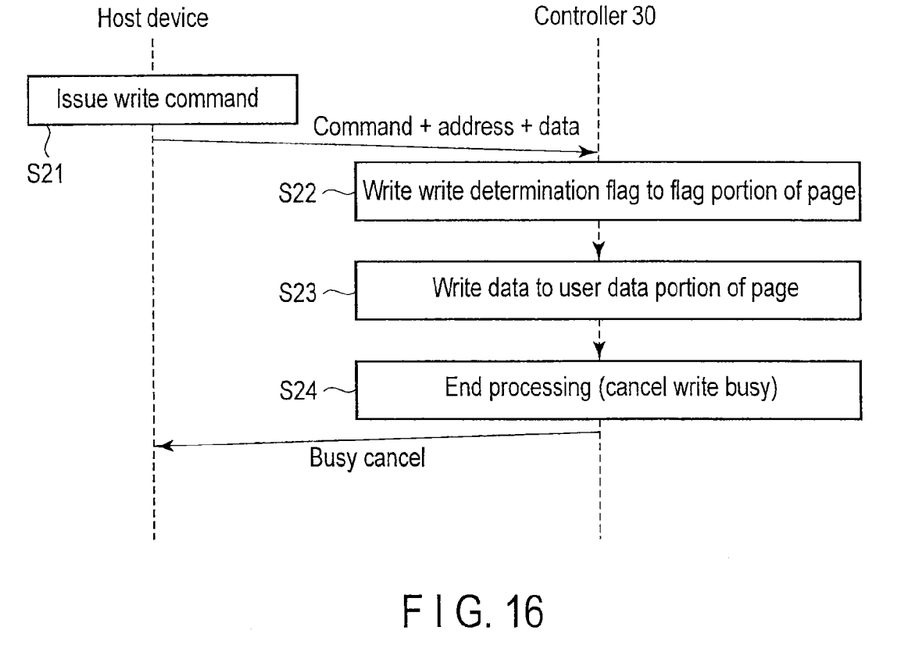
FIG. 16 is a sequence chart showing transmission/reception between a host device and a controller when writing a write determination flag according to the second embodiment.

FIG. 16 is a sequence chart showing transmission/reception between the host device and the controller 30 when writing a write determination flag in a flag portion FL according to the second embodiment.

First, the host device issues a write command to the controller 30 (step S21). At this time, the host device transmits a page address and write data together with the write command.

Upon receiving the write command and the page address, the controller 30 writes "0" to the flag portion FL of the page in the NAND memory 10 designated by the page address as the write determination flag (step S22). That is, the controller 30 writes "0" to the plurality of memory cells ("1") in the flag portion FL ((A)→(B) in FIG. 10) before the write data is written to a user data portion UD of the page. At this time, the threshold of the memory cells to which "0" is written need only be equal to or higher than the verify level. In this case, "1" represents the erased state, and "0" represents the written state.

After that, the controller 30 writes the write data to the user data portion UD of the page (step S23) ((B)→(C) in FIG. 10). When the write of the write determination flag and the write data has thus ended, the controller 30 cancels busy (step S24).

If deterioration of performance caused by performing write to the flag portion FL before write to the user data portion UD is not allowed, a switching means for enabling or disabling the write determination flag write function is provided in the controller 30.

In addition, when the change in the threshold of the memory cell falls within an unproblematic range even if the write is performed simultaneously to the flag portion FL and the user data portion UD, the write can be performed simultaneously to the flag portion FL and the user data portion UD.

Figure 17:
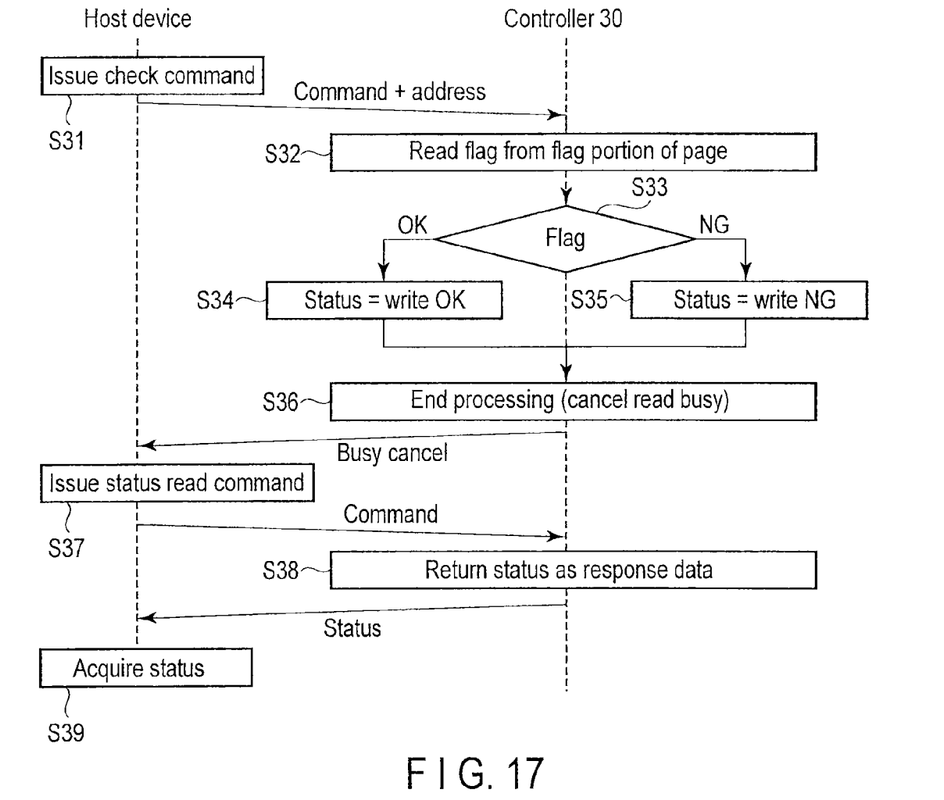
FIG. 17 is a sequence chart showing transmission/reception between the host device and the controller when reading the write determination flag according to the second embodiment.

FIG. 17 is a sequence chart showing transmission/reception between the host device and the controller 30 when reading the write determination flag from the flag portion FL according to the second embodiment.

First, the host device issues, to the controller 30, a check command to check whether write (additional write) is possible or impossible (step S31). At this time, the host device transmits a page address together with the check command.

Upon receiving the check command and the page address, the controller 30 reads the write determination flag from the flag portion FL of the page in the NAND memory 10 designated by the page address (step S32).

Next, the controller 30 determines whether the write determination flag read from the flag portion FL indicates that write is possible (step S33). If write is possible, a status indicating that write is possible is stored in a buffer RAM 33 of the controller 30 (step S34). On the other hand, if write is impossible, a status indicating that write is impossible is stored in the buffer RAM 33 of the controller 30 (step S35). Note that in the above-described first embodiment, since the control circuit 16 in the NAND memory 10 determines whether write is possible or impossible, the status is stored in the status register 18 in the NAND memory 10. In the second embodiment, the controller 30 outside the NAND memory 10 performs the determination and stores the status in the buffer RAM 33.

When the check of the write determination flag has thus ended, the controller 30 cancels busy (step S36).

Upon receiving busy cancel from the controller 30, the host device issues, to the controller 30, a status read command to read whether write is possible or impossible to the page (step S37).

Upon receiving the status read command, the controller 30 returns the status stored in the buffer RAM 33 to the host device as response data (step S38).

The host device receives the status from the controller 30, and recognizes based on the status whether write is possible or impossible to the page (step S39).

[2] Other Writability Determination Function

In the second embodiment, a writability determination function to be described below may be provided.

The host device issues, to the controller 30, a check command to check whether write (additional write) is possible or impossible. Upon receiving the check command, the controller 30 checks whether write is possible or impossible for the NAND memory 10, and returns the result to the host device.

As the method of checking whether write is possible or impossible for the NAND memory 10, the read voltage at the time of read is made lower than the normal read voltage, for example, the read voltage is changed to a negative voltage, and it is checked whether there exists a memory cell whose threshold voltage has shifted from "1" to the "0" side (0'). That is, read is performed for a page at a voltage lower than the voltage upon reading the data stored in the page, and it is determined whether the write to the page is possible or impossible. This method will be described in detail.

Figure 18:
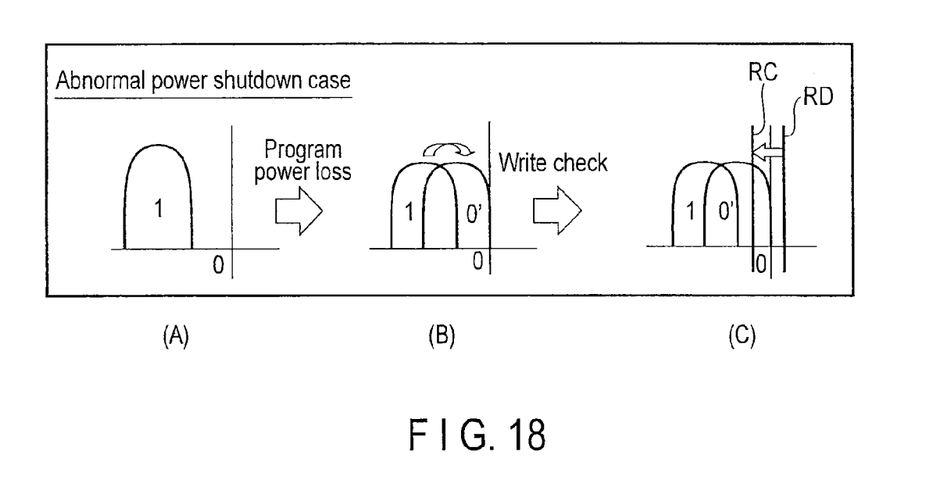
FIG. 18 is a view showing a bit distribution indicating the written state in a page and read voltages.

FIG. 18 is a view showing a bit distribution indicating the written state in a page and read voltages.

If abnormal power shutdown has occurred during write, data of a memory cell shifts from "1" to the "0" side (0') ((A)→(B) in FIG. 18). To check whether there exists a memory cell whose threshold voltage has shifted from "1" to the "0" side (0'), read is performed by a read voltage RC indicated by (C) of FIG. 18. At this time, the read voltage RC is lower than a normal read voltage RD and has, for example, a negative voltage.

In the method of lowering the read voltage and checking whether there exists a memory cell (bit) whose threshold voltage has shifted from "1" to the "0" side, a memory cell whose threshold voltage has slightly shifted from "1" to the "0" side in the case B, that is, due to read disturb stress can also be detected. For this reason, the problem caused in the case B can also be avoided.

As described above, even when abnormal power shutdown occurs or excessive read disturb stress is applied during write, it can be determined whether write to the page is possible or impossible. This can prevent abnormal write (error bit) from occurring in write later.

As described above, according to the first and second embodiments, it is determined whether write to the storage area (page) is possible or impossible, thereby preventing abnormal write (error bit) from occurring in write later.

Note that the method shown in FIG. 18, which performs read at a voltage lower than the normal read voltage and determining whether write to the page is possible or impossible, is also applicable to the first embodiment.

In the above-described first and second embodiments, a case in which the memory cell is a single level cell (SLC) has been described. However, the embodiments can also be applied to a case in which the memory cell is a multilevel cell (MLC). A multilevel cell stores data of 2 bits or more in one memory cell.

In the above-described first and second embodiments, a case in which the semiconductor memory is a NAND flash memory has been described. However, the embodiments can also be applied to any other semiconductor memory that stores data based on the level of the threshold voltage of a memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of second storage areas including a plurality of first storage areas each having a plurality of memory cells configured to store data; and
   a control circuit configured to control the nonvolatile memory, wherein
   each first storage area includes a data portion to store the data and a flag portion to store information representing whether write to the data portion is possible or impossible,
   each first storage area is a unit of data write,
   each second storage area is a unit of data erase,
   the control circuit writes the information to the flag portion of one of the first storage areas and then writes the data to the data portion, and
   the control circuit reads the information from the flag portion of the one of the first storage areas, and then determines whether write to the one of the first storage areas is possible or impossible based on the read information.

2. The memory system according to claim 1, further comprising a register,
   wherein the control circuit stores a result of the determination in the register.

3. The memory system according to claim 1, wherein the control circuit writes, to the flag portion, the information representing that the write to the first storage area is impossible and then writes the data to the data portion in accordance with an externally input write command.

4. The memory system according to claim 1, wherein the control circuit reads the information from the flag portion, determines whether the information represents that the write is possible, and stores a result of the determination in a register in accordance with an externally input check command.

5. The memory system according to claim 3, further comprising a switching unit configured to switch whether to write the information to the flag portion.

6. The memory system according to claim 1, wherein if the flag portion is in an erase state, the information represents that the write is possible, and if the flag portion is in a written state, the information represents that the write is impossible.

7. The memory system according to claim 1, wherein the control circuit performs read from the first storage area at a voltage lower than a voltage for reading the data stored in the first storage area, and determines whether the write to the first storage area is possible or impossible.

8. The memory system according to claim 1, wherein the first storage area includes a page that is a unit of write and read.

9. The memory system according to claim 1, wherein the nonvolatile memory and the control circuit are formed on the same semiconductor substrate.

10. The memory system according to claim 1, wherein the nonvolatile memory and the control circuit are sealed by the same resin material.

11. The memory system according to claim 1, wherein the control circuit includes an interface configured to transmit/receive a signal to/from the nonvolatile memory.

12. The memory system according to claim 11, further comprising a register,
    wherein the control circuit stores a result of the determination in the register.

13. The memory system according to claim 11, wherein the control circuit performs read from the first storage area at a voltage lower than a voltage for reading the data stored in the first storage area, and determines whether the write to the first storage area is possible or impossible.

14. The memory system according to claim 11, wherein the nonvolatile memory and the control circuit are formed on different semiconductor substrates, respectively.

15. The memory system according to claim 11, wherein the nonvolatile memory and the control circuit are sealed by different resin materials, respectively.

16. The memory system according to claim 1, wherein the nonvolatile memory and the control circuit form a NAND flash memory.

17. The memory system according to claim 1, wherein the nonvolatile memory forms a NAND flash memory, and the control circuit forms a controller configured to control the NAND flash memory.

* * * * *